United States Patent
Mitchell et al.

(10) Patent No.: US 9,666,781 B2
(45) Date of Patent: May 30, 2017

(54) METHODS FOR RECOVERING WASTE ENERGY FROM BLEED AIR DUCTS

(71) Applicant: The Boeing Company, Chicago, IL (US)

(72) Inventors: Bradley J. Mitchell, Snohomish, WA (US); Trevor M. Laib, Woodinville, WA (US); Sridhar K. Iya, Gig Harbor, WA (US); George M. Roe, Seatle, WA (US)

(73) Assignee: The Boeing Company, Chicago, IL (US)

( * ) Notice: Subject to any disclaimer, the term of this patent is extended or adjusted under 35 U.S.C. 154(b) by 796 days.

(21) Appl. No.: 13/970,416

(22) Filed: Aug. 19, 2013

(65) Prior Publication Data

US 2015/0047684 A1 Feb. 19, 2015

(51) Int. Cl.
| | |
|---|---|
| *B64C 3/14* | (2006.01) |
| *B64D 41/00* | (2006.01) |
| *H01L 35/28* | (2006.01) |
| *B64D 13/00* | (2006.01) |
| *B64D 13/06* | (2006.01) |

(52) U.S. Cl.
CPC .............. *H01L 35/28* (2013.01); *B64D 13/00* (2013.01); *B64D 41/00* (2013.01); *B64D 2013/0618* (2013.01); *Y02T 50/53* (2013.01); *Y02T 50/56* (2013.01)

(58) Field of Classification Search
CPC ........................................................ F25B 21/02
See application file for complete search history.

(56) References Cited

U.S. PATENT DOCUMENTS

| | | | | |
|---|---|---|---|---|
| 3,541,342 A | * | 11/1970 | Majkrzak | F01D 25/22 290/2 |
| 6,100,463 A | * | 8/2000 | Ladd | H01L 35/34 136/201 |
| 2005/0252193 A1 | * | 11/2005 | Iya | F02K 1/822 60/204 |
| 2007/0137687 A1 | | 6/2007 | Tanielian | |

(Continued)

FOREIGN PATENT DOCUMENTS

| | | |
|---|---|---|
| FR | 2947529 A1 | 1/2011 |
| WO | 0161768 A1 | 8/2001 |
| WO | 2010042215 A1 | 4/2010 |

OTHER PUBLICATIONS

Ringler, J., Seifert, M., Guyotot, V., and Hübner, W., "Rankine Cycle for Waste Heat Recovery of IC Engines," SAE Int. J. Engines 2(1):67-76, 2009, doi:10.4271/2009-01-0174.

(Continued)

*Primary Examiner* — Magali P Slawski
(74) *Attorney, Agent, or Firm* — Felix L. Fischer

(57) ABSTRACT

A thermal energy harvester and power conversion system employs a bleed air duct containing the flow of high temperature air from an engine. A lower temperature air source is included with an energy conversion device having a hot interface operably engaged to the bleed air duct and a cold interface operably engaged to the lower temperature air source. The energy conversion device generates electrical power from a thermal gradient between the bleed air duct and the lower temperature air source and the electrical power is routed to a power feeder.

20 Claims, 16 Drawing Sheets

(56) References Cited

U.S. PATENT DOCUMENTS

| | | | |
|---|---|---|---|
| 2007/0231729 A1 | 10/2007 | Ohno et al. | |
| 2010/0199687 A1* | 8/2010 | Woods | F25B 21/02 |
| | | | 62/3.7 |
| 2011/0131999 A1* | 6/2011 | Gao | B64D 13/06 |
| | | | 60/782 |
| 2012/0174956 A1* | 7/2012 | Smythe | H01L 35/08 |
| | | | 136/230 |

OTHER PUBLICATIONS

Sanzi, James L.; Jaworske, Donald A.; "Heat Pipes and Heat Rejection Component Testing at NASA Glenn Research Center", NASA/TM-2012-217205, Feb. 2012.

Moczygemba, Joshua; "Energy Harvesting TEG Power Strap for Industrial, Chemical, Oil and Gas Applications", White Paper, Marlow Industries, Inc., Mar. 19, 2012.

* cited by examiner

METHODS FOR RECOVERING WASTE ENERGY FROM BLEED AIR DUCTS

BACKGROUND INFORMATION

Field

Embodiments of the disclosure relate generally to the field of electrical energy generation and more particularly to a thermoelectric generators (TEG) or heat pipes in combination with a heat engine to employ bleed air duct temperature differential with local ambient for electrical power generation to be reintroduced into an aircraft electrical power system.

Background

Commercial aircraft employ shaft power from main propulsion engines and/or auxiliary power units (APU) (referred to jointly herein as engines) to provide electrical power using electric generators. These generators extract horsepower from the engine shaft and thus contribute to greater fuel consumption. The engines also provide bleed air air for environmental control systems (ECS) and pneumatic systems operation. Bleed air typically is routed from the engine to the ECS or pneumatic systems through a bleed air duct. Temperature of bleed air in the duct may range from 300 to 1000° F. and the bleed air is typically exchanges heat with cool air for ECS or pneumatic system operation. At least a portion of the initial heat energy in the bleed air is therefore not productively employed.

It is therefore desirable to provide conversion systems for harvesting waste heat for electrical power generation.

SUMMARY

Embodiments disclosed herein provide thermal energy harvester and power conversion system that employs a bleed air duct containing the flow of high temperature air from an engine. A lower temperature air source is included with an energy conversion device having a hot interface operably engaged to the bleed air duct and a cold interface operably engaged to the lower temperature air source. The energy conversion device generates electrical power from a thermal gradient between the bleed air duct and the lower temperature air source and the electrical power is routed to a power feeder.

The embodiments provide a method for generation of supplemental electrical power from waste heat in bleed air ducting of an aircraft by coupling an energy conversion device at a hot interface to a bleed air duct and coupling the energy conversion device at a cold interface to an ambient temperature sink. Electrical power is generated with the energy conversion device through use of a thermal gradient between the bleed air duct and ambient temperature sink. The electrical power is then distributed through a power feeder in an aircraft The features, functions, and advantages that have been discussed can be achieved independently in various embodiments of the present disclosure or may be combined in yet other embodiments further details of which can be seen with reference to the following description and drawings.

DETAILED DESCRIPTION

Figure 1A:
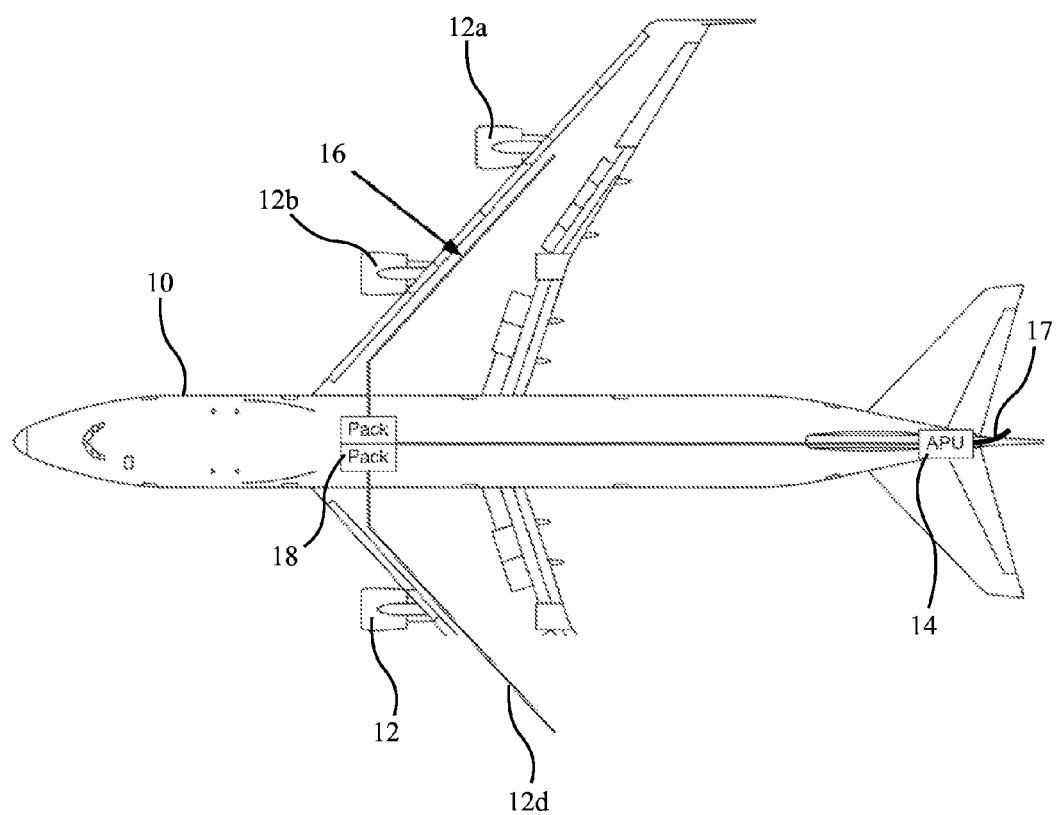
FIG. 1A is a plan view of an exemplary commercial aircraft with propulsion engines and APU with bleed air ducts shown connecting to ECS packs.

Embodiments disclosed herein provide apparatus and methods for converting waste heat from bleed air ducts into useful electrical power, thus reducing the electric load on the generators and thereby reducing engine horsepower extraction and fuel consumption. Referring to the drawings, FIG. 1 shows an example aircraft 10 having main propulsion engines 12a, 12b, 12c and 12d and an APU 14 (each referred to herein generally as an engine). Bleed air from each engine 12a, 12b, 12c, 12d and 14 is collected in bleed air ducts 16 and provided to other aircraft system such as ECS packs 18 or pneumatic systems (not shown). An example bleed air duct 16 is shown in FIG. 1B routed through the internal volume of a wing leading edge section having a spar 20, cord forms 22 and structural attachments 24 for the leading edge skin 26.

Figure 2:
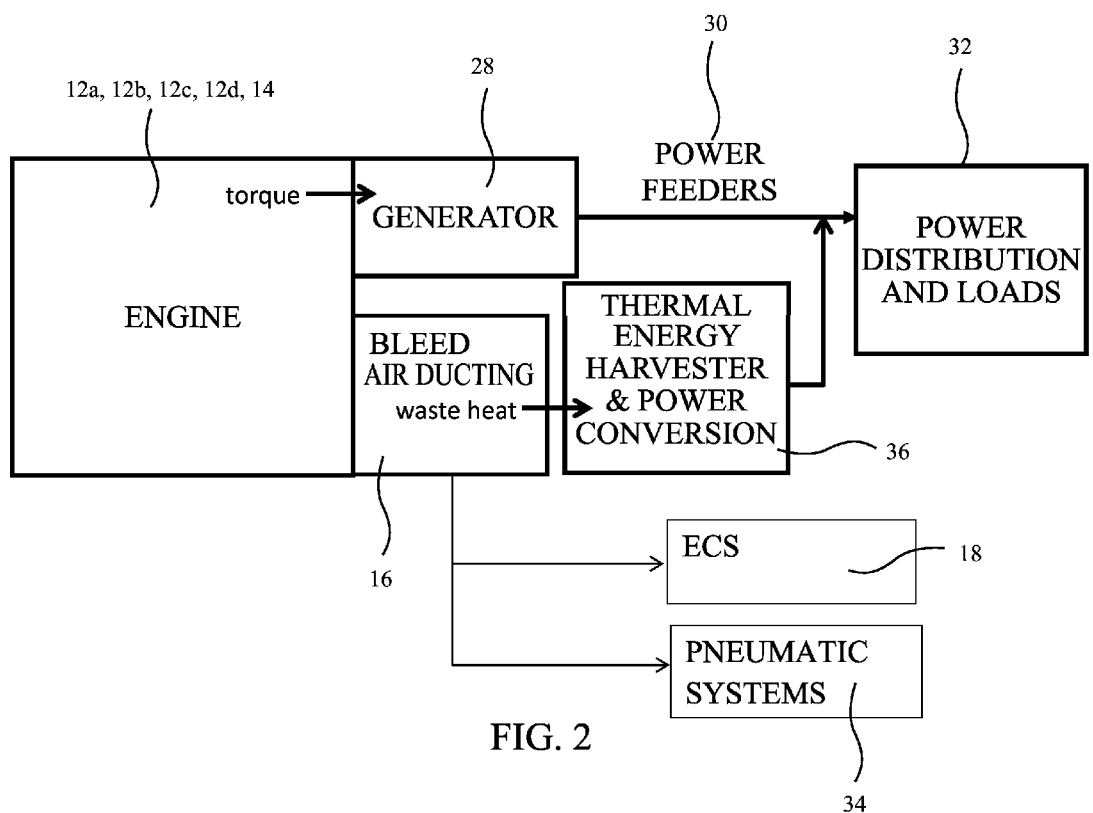
FIG. 2 is a block diagram of the bleed air system incorporating an embodiment as disclosed herein for harvesting of waste heat.

As shown in FIG. 2, torque from the engine 12a, 12b, 12c, 12d or 14 drives a generator 28 which provides electrical power through power feeders 30 for use by electrical systems in the aircraft, generally identified as power distribution and loads 32. The bleed air duct 16 provides high temperature/high pressure air to the ECS 18 and pneumatic systems 34 such as wing anti-ice, engine starters, hydraulic reservoir pressurization, potable water pressurization, air driven hydraulic pumps, pneumatic/hydraulic converters and emergency gear extension systems. A thermal energy harvester and power conversion system 36 employs waste heat from the bleed air duct 16 and provides supplemental electrical power to the power feeders 30 or power distribution or loads 32.

Figure 3:
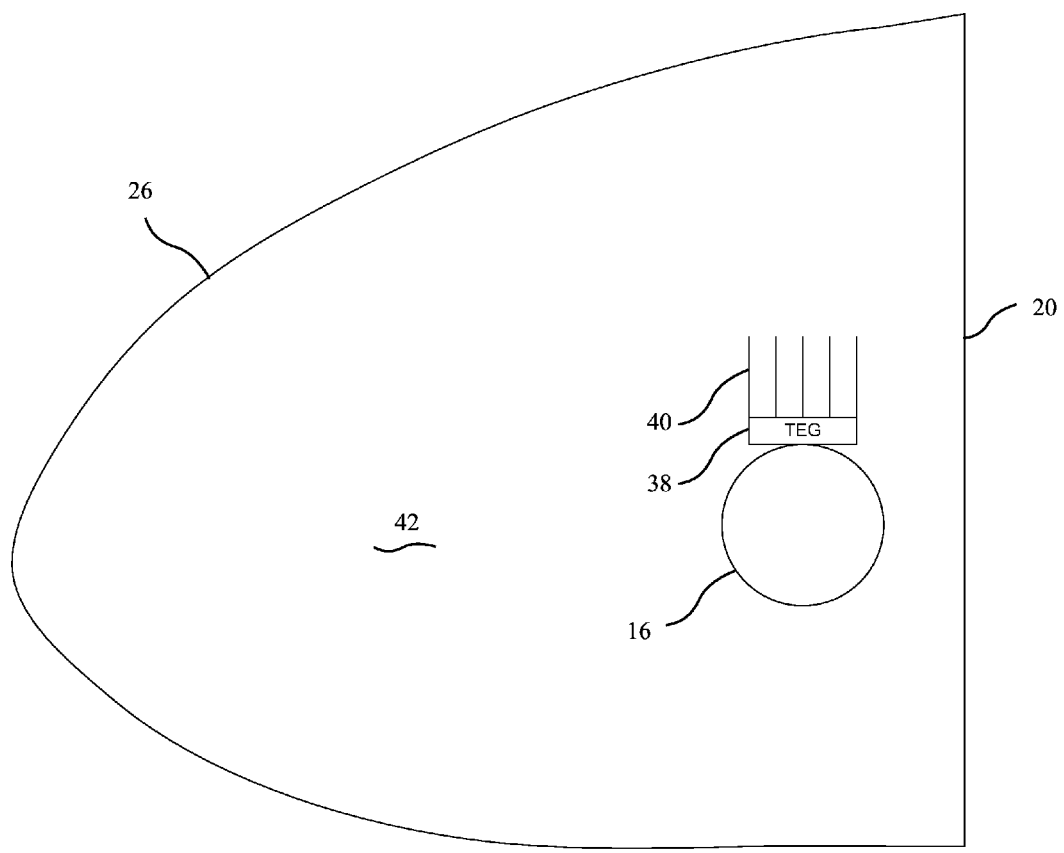
FIG. 3 is a schematic side view of the wing leading edge volume and bleed air duct with a first embodiment of the waste energy harvesting system employing a thermoelectric generator (TEG) installed on the bleed air duct.

A first embodiment of the thermal energy harvester and power conversion system is shown in FIG. 3. The thermal energy conversion device is a thermoelectric generator (TEG) 38 is mounted to bleed air duct 16 as will be described in greater detail subsequently. A convective heat exchanger 40 extends from a cold side interface of the TEG into the inner volume 42 of the leading edge section. Ambient conditions inside the inner volume 42 may vary from a sea level standard day temperature of 40-80° F. to −21° F. at operating altitude. Temperature differential between the hot side interface and cold side interface of the TEG may therefore range from approximately 220-1020° F. with typical initial bleed air temperatures of 300-380° F.

Figure 4:
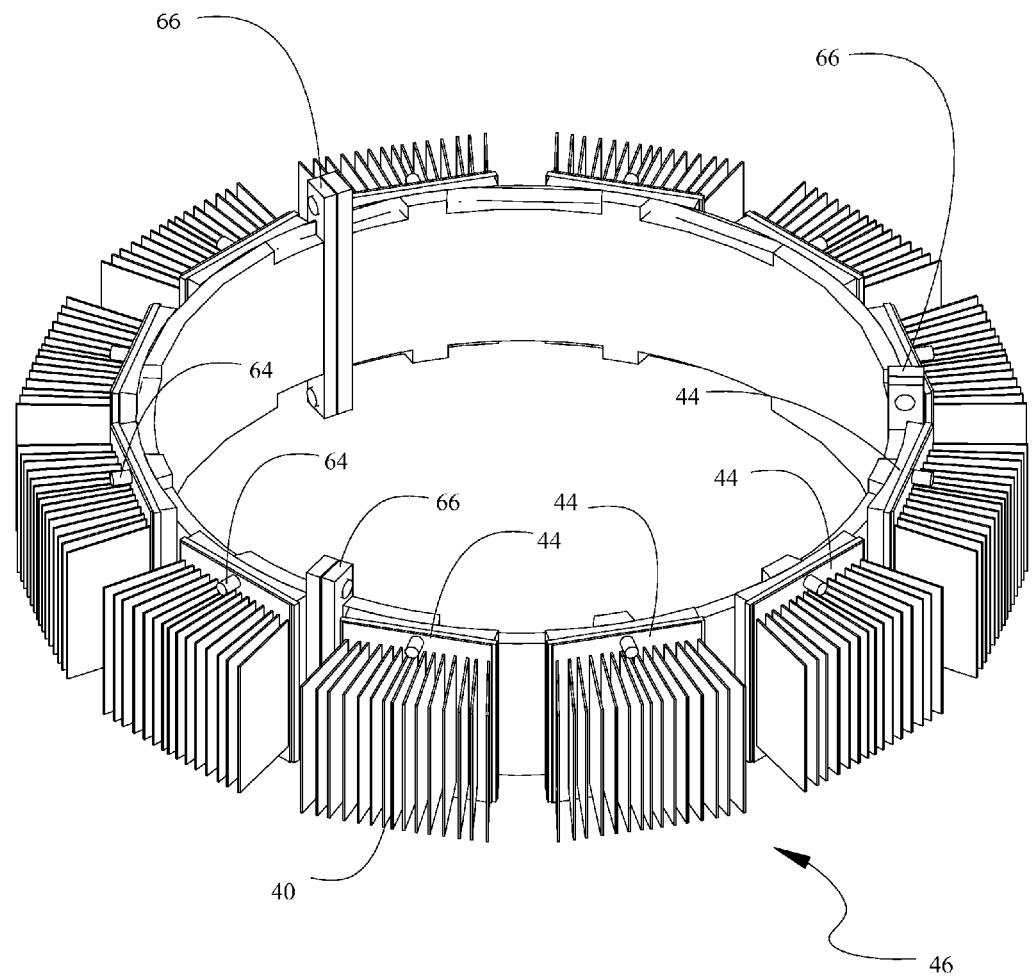
FIG. 4 is a pictorial view of an exemplary TEG employed in the embodiment of FIG. 3.
Figure 5A:
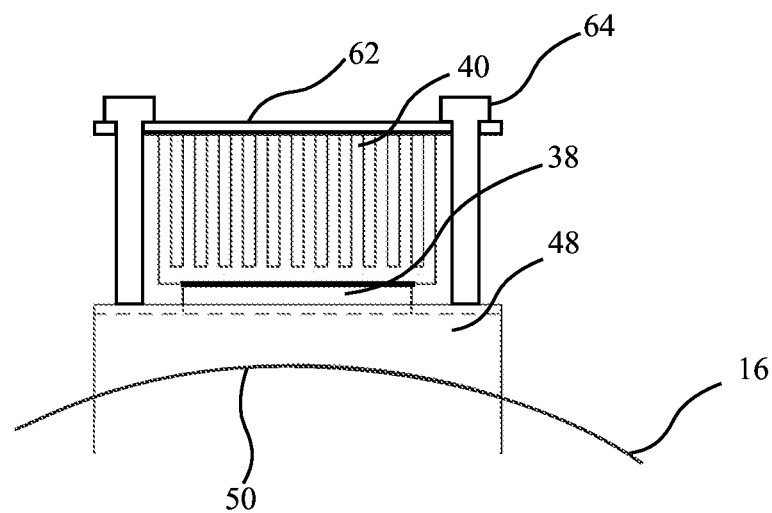
FIGS. 5A and 5B are a side and front views of a TEG segment from the TEG of FIG. 4.
Figure 5B:
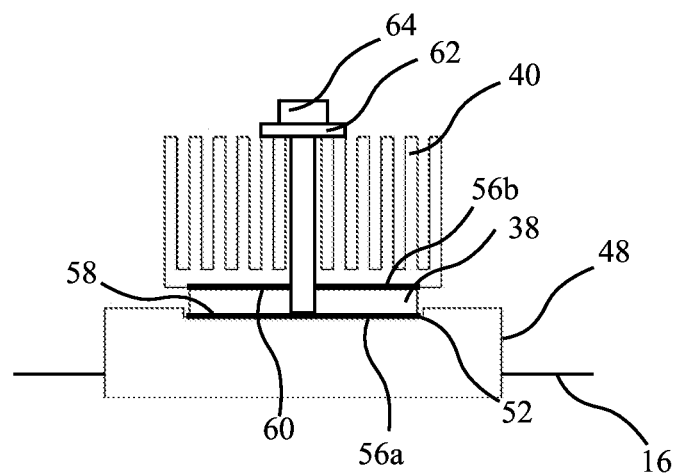

An exemplary implementation of the embodiment of FIG. 3 is shown in FIGS. 4, 5A and 5B. As seen in FIG. 4 multiple generator segments 44 are interconnected to form an encircling ring 46 which engages the bleed air duct 16. As shown in FIGS. 5A and 5B, each generator segment 44 incorporates thermal conductor such as a profile adapter 48 which also acts as a geometric adapter having a curved inner surface 50 matching the periphery of the bleed air duct 16 for operable engagement. A TEG 38 engages a relief 52 on an outer surface 54 of the profile adapter 48. A thermal compound layer 56a such as Antec Advance thermal compound produced by Antec, Inc., Freemont, Calif. is added between a hot interface surface 58 of the TEG 38 and profile adapter 48 for enhanced thermal conduction. Heat exchanger 40 engages TEG 38 on a cold interface surface 60 with an intermediate thermal compound layer 56b such as Arctic Silver thermal compound produced by Artic Silver Incorporated, Visalia, Calif. to enhance thermal conduction. In alternative embodiments carbon felts or similar materials may be substituted for the thermal compound layers to act as conductive thermal transfer elements. For the embodiment shown, the heat exchanger 40 is constrained by a strap 62 secured to the profile adapter 48 with bolts 64. For the exemplary embodiment with a titanium bleed air duct 16 having a diameter of 7 inches, each generator segment 44 incorporates a profile adapter 48 fabricated from aluminum with a width of about 2.09 inches and a length of approximately 2.06 inches. Relief 52 is approximately 0.03 inches in depth and inset from the longitudinal edges of the profile adapter 48 by about 0.41 inches. For the example embodiment shown in FIG. 4, 12 segments 44 are employed in the ring 46 with the groups of four segments rigidly interconnected and three separable joints 66 in the ring for mounting to the bleed air duct 16. An example TEG system which may be employed in this embodiment is an Evergen Power Strap produced by Marlow Industries, Inc. 10451 Vista Park Road, Dallas, Tex. 75238. Alternatively, segments 44 are employed in a ring 46 by connecting them together with chain links for wrapping around the bleed air duct 16. Multiple rings may be mounted to the bleed air duct 16 in alternative embodiments and the design and dimensions disclosed herein for the embodiment are not intended to be limiting.

In operation, TEG 38 converts heat from the bleed air duct 16 conducted through the adapter 48 and exhausted through the heat exchanger 40, which is exposed to ambient conditions in the wing leading edge volume 42, to DC electrical current for transmission to the power feeders 30 in the aircraft electrical system as previously described typically including regulation to 28 VDC for distribution on 28 VDC buses or conversion to AC power through an inverter and transformer for distribution on AC buses.

Figure 6:
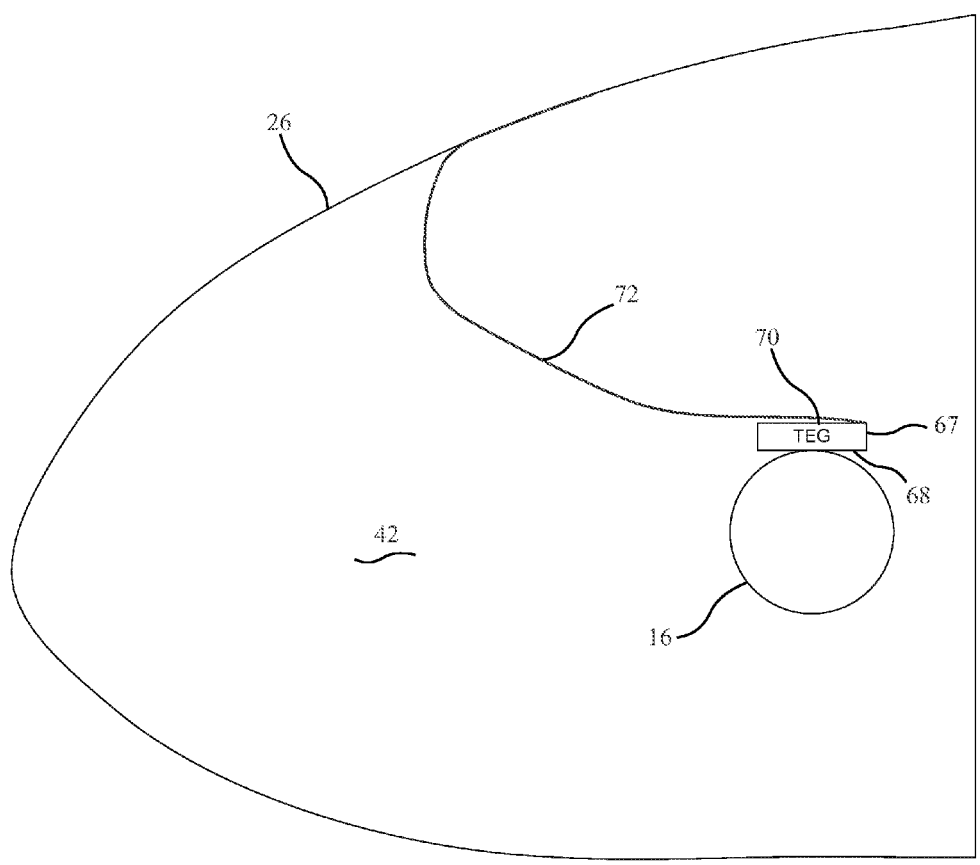
FIG. 6 is a schematic side view of the wing leading edge volume and bleed air duct with a second embodiment of the waste energy harvesting system employing a thermoelectric generator (TEG) installed on the bleed air duct with a heat pipe conducting heat from the TEG to the leading edge surface of the wing as the cold sink.

A second embodiment of the thermal energy harvester and power conversion system is shown in FIG. 6. A TEG 67 is mounted with a hot interface surface 68 conductively engaging the bleed air duct 16. Mounting configuration may be similar to the adapter disclosed with respect to the first embodiment. A cold interface surface 70 of the TEG 66 is conductively engaged to a heat pipe 72 which is routed in the wing leading edge volume 42 to a portion of the leading edge skin 26. Heat pipe 72 withdraws heat from the TEG cold side transferring it to the leading edge skin 26 from which the airstream flowing over the aircraft surface provides an ambient sink temperature nominally between −21 and 80° F. Exemplary technologies for heat pipes implementable in the described embodiments are known in the art as disclosed in "Heat Pipes and Heat Rejection Component Testing at NASA Glenn Research Center" NASA/TM-2012-217205, February 2012. In alternative embodiments, a pumped thermal fluid conduit may be employed as a replacement for the heat pipe 72. Through conductive connection of the heat pipe 72, the TEG converts heat conducted from the bleed air duct 16 to electrical current for transmission to the power feeders 30 as previously described. While shown in the drawing as a single TEG and heat pipe pair, alternative embodiments may employ multiple TEGs mounted circumferentially and/or longitudinally on the bleed air duct, each conductively connected to the leading edge wing skin with an associated heat pipe.

Figure 7:
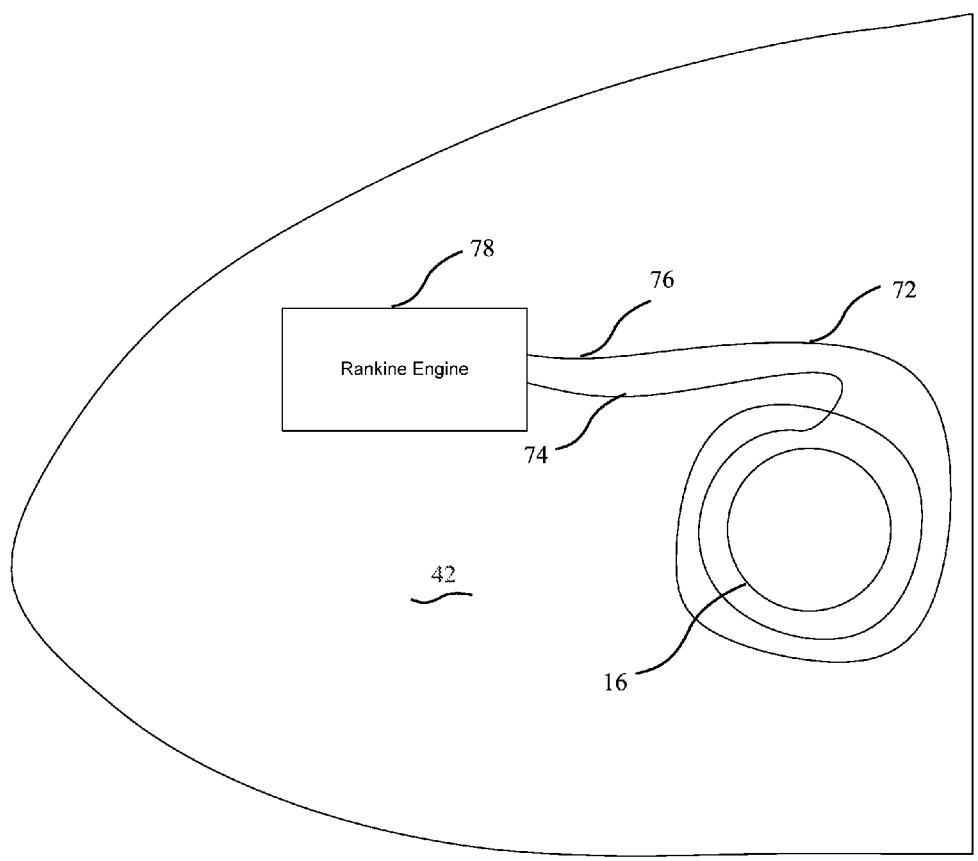
FIG. 7 is a schematic side view of the wing leading edge volume and bleed air duct with a third embodiment of the waste energy harvesting system employing a pulsed heat pipe wrapped on the bleed air duct and conducting heat to a Rankine engine.

A third embodiment of the thermal energy harvester and power conversion system is shown in FIG. 7 in which a pulsed heat pipe 72 is coiled on the bleed air duct 16 with a cold interface termination 74 and a hot interface termination 76 operably attached to a Rankine engine 78 as the thermal energy conversion device. The Rankine engine 78 may employ ambient conditions within the leading edge volume 42 or secondary connection to the wing skin 26 or alternative structure for the cold sink for a condenser for operation as known to those skilled in the art. An example Rankine engine for implementation in the described embodiments would be comparable to the Green Machine 4000 series of products by ElectraTherm, 4750 Turbo Circle, Reno, Nev. 89502, Electrical current generate by the Rankine engine 78 is then routed to the power feeders 30 as previously described.

Figure 8:
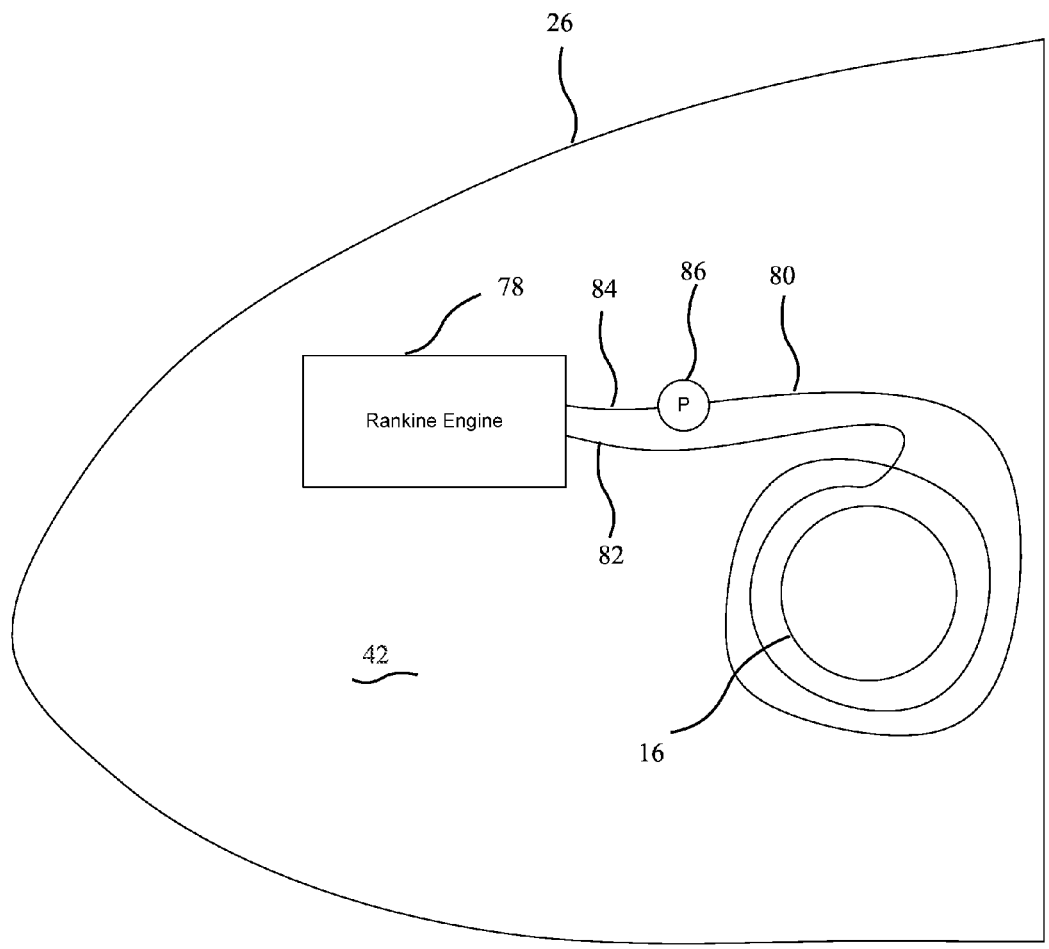
FIG. 8 is a schematic side view of the wing leading edge volume and bleed air duct with a fourth embodiment of the waste energy harvesting system employing a fluid filled heat transfer conduit wrapped on the bleed air duct having a pump for conducting heat to a Rankine engine.

FIG. 8 shows a fourth embodiment of the thermal energy harvester and power conversion system also employing a Rankine engine 78. A fluid heat transfer conduit 80 is coiled on the bleed air duct 16 with a cold interface termination 82 and a hot interface termination 84 operably attached to a Rankine engine 78. A pump 86 circulates the fluid in the fluid heat transfer conduit 80. The Rankine engine 78 may employ ambient conditions within the leading edge volume 42 or secondary connection to the wing skin 26 or alternative structure for the cold sink for operation as known to those skilled in the artElectrical current generate by the Rankine engine 78 is then routed to the power feeders 30 as previously described.

In either of the third or fourth embodiments, the Rankine engine may be replaced with a Sterling engine with a regenerator acting as the cold interface.

Figure 9:
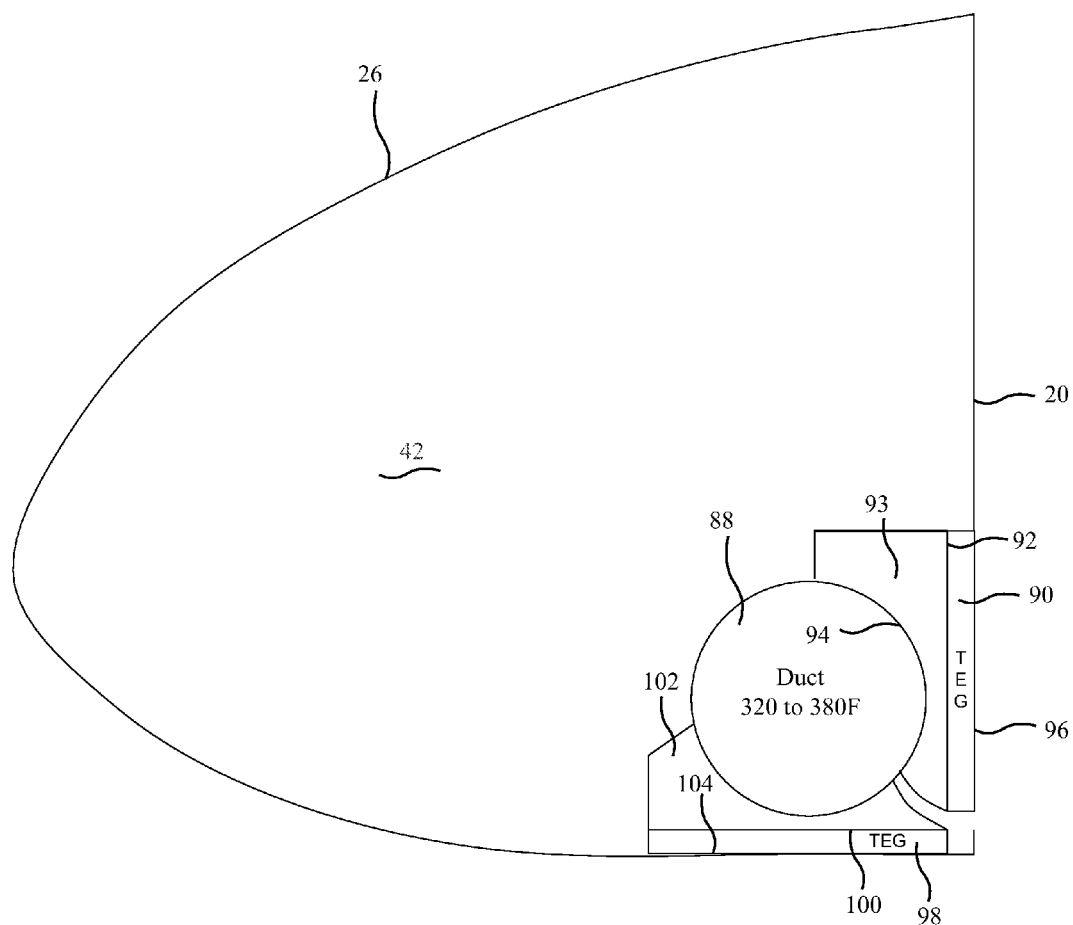
FIG. 9 is a schematic side view of the wing leading edge volume and a rectangular bleed air duct in a fifth embodiment of the waste energy harvesting system employing TEGs intermediate the rectangular duct and spar or wing skin which act as a direct cold side heat sink.

TEGs may also be employed in alternative configurations using direct heat transfer to structural components or skin elements as shown for a fifth embodiment of the thermal energy harvester and power conversion system in FIG. 9. A bleed air duct 88 is supported within the leading edge volume 42 with a first TEG 90 engaged at a hot interface surface 92 using a cylindrical to rectangular geometry adapter between a first surface 94 of the bleed air duct and at a cold interface surface 96 at a surface of the wing spar 20. An additional or alternative TEG 98 is engaged at a hot interface surface 100 through a second cylindrical to rectangular geometry adapter 102 between the surface 94 of the bleed air duct 88 and at a cold interface surface 104 at the leading edge wing skin 26. The wing skin 26 and wing spar 20 provide cold ambient heat sinks for the TEGs Conductive heat transfer through the TEGs 90 and 94 generates electrical current to be routed to the power feeders 30 as previously described.

Figure 10:
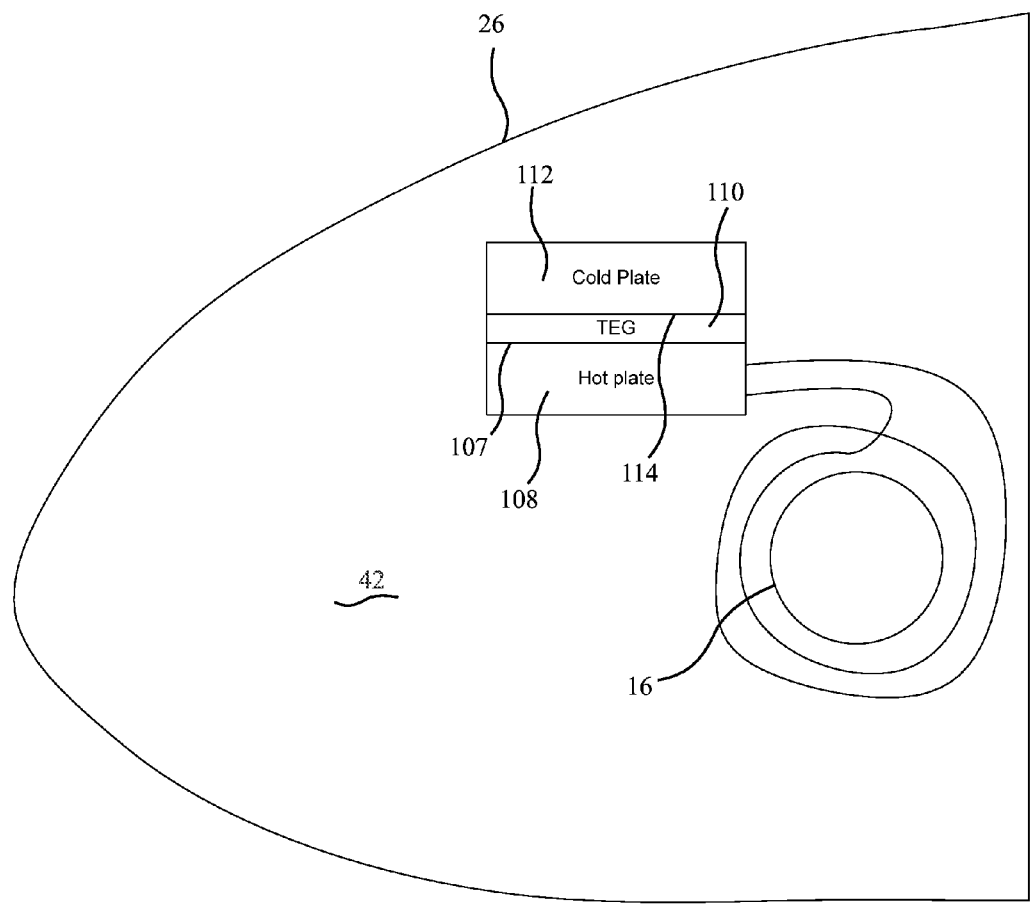
FIG. 10 is a schematic side view of the wing leading edge volume and bleed air duct with a sixth embodiment of the waste energy harvesting system employing a pulsed heat pipe wrapped on the bleed air duct and conducting heat to a hot adapter as the hot side interface of a TEG with a cold adapter interface in the ambient temperature space of the wing leading edge volume.

Employing TEGs remotely from the bleed air duct 16 may be accomplished in a sixth embodiment of the thermal energy harvester and power conversion system as shown in FIG. 10. A pulsed heat pipe 106 is coiled around the bleed air duct 16 and attached to a hot plate 108 engaged to a hot interface surface 109 of a TEG 110 A cold plate 112 is engaged to a cold interface surface 114 of the TEG 110. The cold plate may operate as a conductive or convective heat sink for thermal transfer to ambient conditions in the leading edge volume 42 or may be connected with conductive elements to the wing skin 26 or other structural elements to provide a cold ambient heat sink. Heat transmitted through the pulsed heat pipe 106 maintains the hot plate at an elevated temperature for operation of the TEG 110. Conductive heat transfer through the TEG110 generates electrical current to be routed to the power feeders 30 as previously described.

Figure 11:
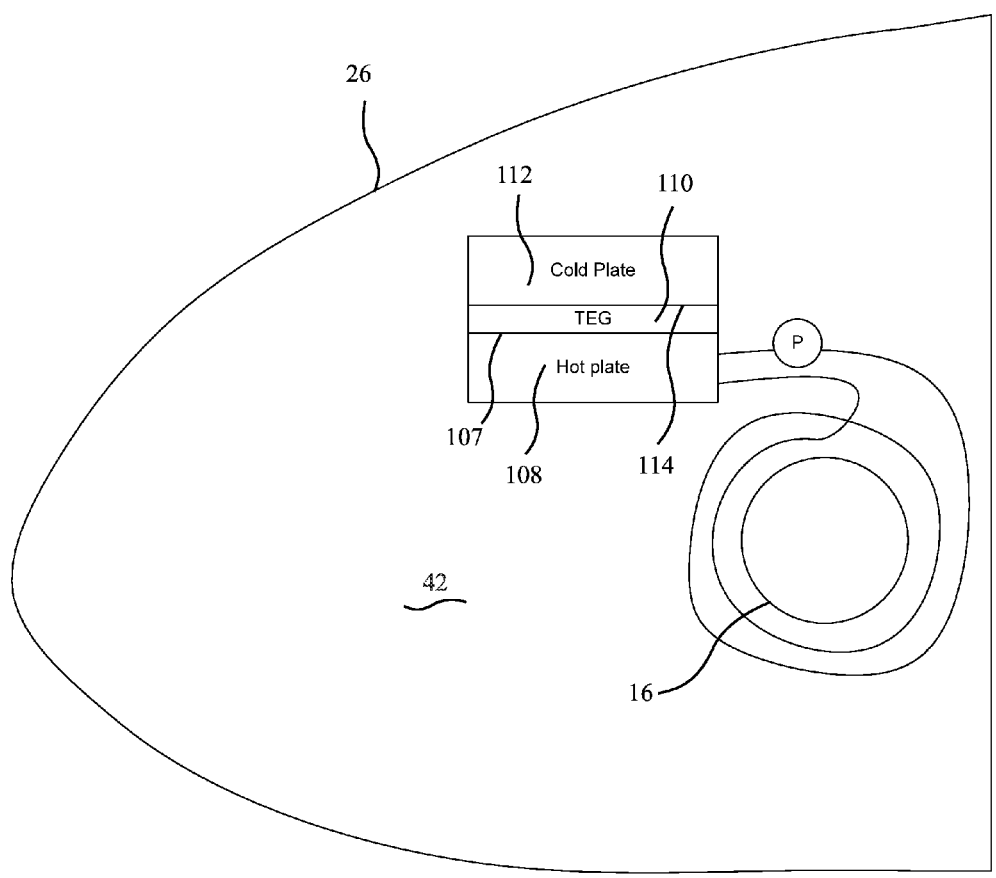
FIG. 11 is a schematic side view of the wing leading edge volume and bleed air duct with a seventh embodiment of the waste energy harvesting system employing a fluid filled heat transfer conduit wrapped on the bleed air duct having a pump for conducting heat to a hot adapter as the hot side interface of a TEG with a cold adapter interface in the ambient temperature space of the wing leading edge volume.

A seventh embodiment of the thermal energy harvester and power conversion system also employing a TEG remotely mounted from the bleed air duct 16 is shown in FIG. 11. The hot plate 108 of the TEG 110 is heated using a fluid heat transfer conduit 116 coiled around the bleed air duct 16 with a pump 118 circulating fluid such as propylene-glycol water mixtures and dielectric fluids already available on the aircraft to the heat transfer conduit. As in the prior embodiment, cold plate 112 is engaged to a cold interface surface 114 of the TEG 110. The cold plate may incorporate conductive or convective heat transfer to ambient conditions in the leading edge volume 42 or may be connected with conductive elements to the wing skin 26 or other structural elements to provide a cold ambient heat sink. Heat transmitted through the pumped fluid heat transfer conduit 116 maintains the hot plate 108 at an elevated temperature for operation of the TEG 110. Conductive heat transfer through the TEG110 generates electrical current to be routed to the power feeders 30 as previously described.

Figure 12:
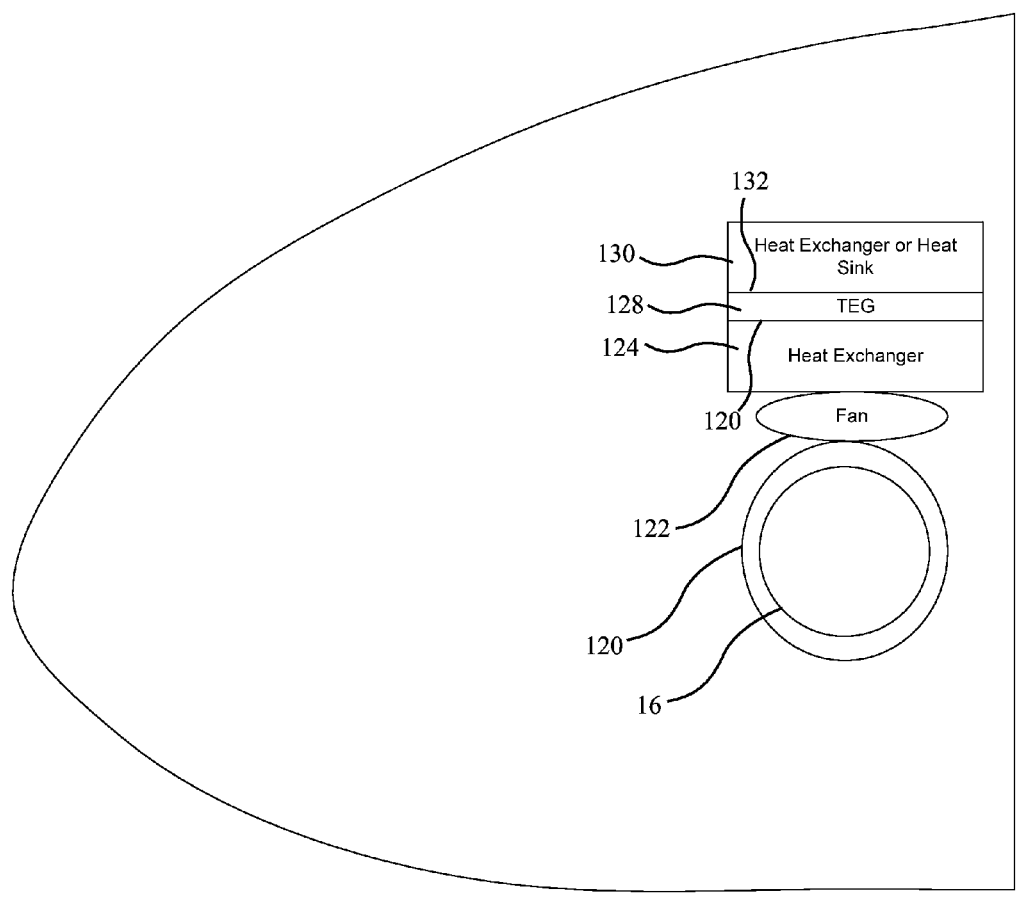
FIG. 12 is a schematic side view of the wing leading edge volume and bleed air duct with an eighth embodiment of the waste energy harvesting system employing an annular duct surrounding the bleed air duct with a fan forcing air from the annular duct through a heat exchanger on the hot side interface of a TEG with a heat exchanger or heat sink to cold ambient in the leading edge volume on the cold side interface of the TEG.

FIG. 12 demonstrates an eighth embodiment of the thermal energy harvester and power conversion system. A concentric plenum or sleeve 120 surrounds the bleed air duct 16 and a fan 122 circulates air or other working gas from the sleeve into a heat exchanger 124 for convective thermal. Heat exchanger 124 is operably engaged to a hot interface surface 126 of a TEG 128. A second heat exchanger 130 or other heat sink is operably engaged to a cold interface surface 132 of the TEG 128 and may incorporate conductive or convective heat transfer to ambient conditions in the leading edge volume 42 or may be connected with conductive elements to the wing skin 26 or other structural elements to provide a cold ambient heat sink. The fan circulated working fluid from the sleeve 120 and heat exchanger 124 provides convective thermal transfer and maintains the hot interface surface 126 at an elevated temperature for operation of the TEG 110. Conductive heat transfer through the TEG110 generates electrical current to be routed to the power feeders 30 as previously described.

Figure 13:
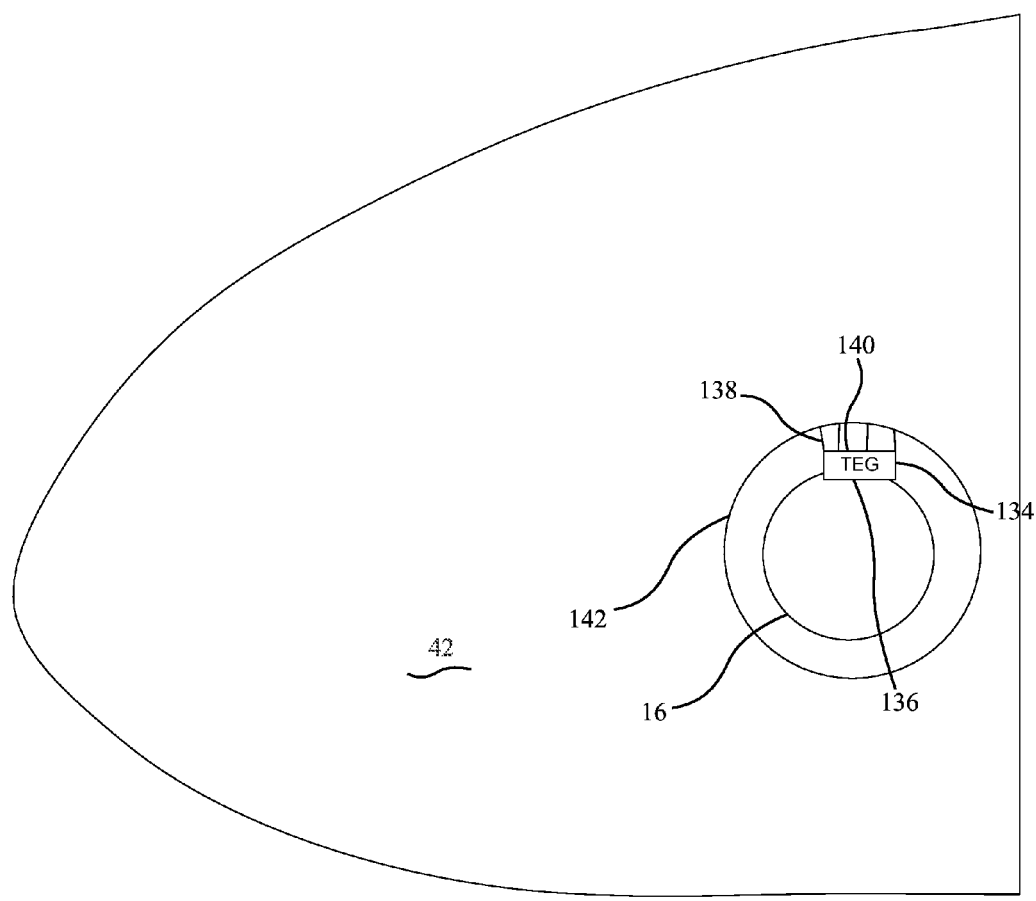
FIG. 13 is a schematic side view of the wing leading edge volume and bleed air duct with a ninth embodiment of the waste energy harvesting system employing an annular duct surrounding the bleed air duct with a TEG directly interfaced on the hot side to the bleed air duct as described with respect to FIG. 3 with a cold side heat sink in the annular duct cooled by forced air convection in the duct.

In a similar ninth embodiment shown in FIG. 13, a TEG 134 is mounted with a hot interface surface 136 conductively engaging the bleed air duct 16. Mounting configuration may be similar to the adapter disclosed with respect to the first embodiment. A heat exchanger 138 similar to that disclosed in the first embodiment is operably engaged to a cold interface surface 140 on the TEG 134. A sleeve 142 concentrically surrounds the bleed air duct 16 and mounted TEG 134 and heat exchanger 138, allowing working fluid in the sleeve to be received over the heat exchanger for convective cooling. The working fluid may be ambient air circulated from the leading edge volume 42. Enhancement of the efficiency of the heat exchanger 138 through use of the sleeve contained working fluid may allow reduction in heat exchanger size and weight. Conductive heat transfer through the TEG134 generates electrical current to be routed to the power feeders 30 as previously described.

Figure 14:
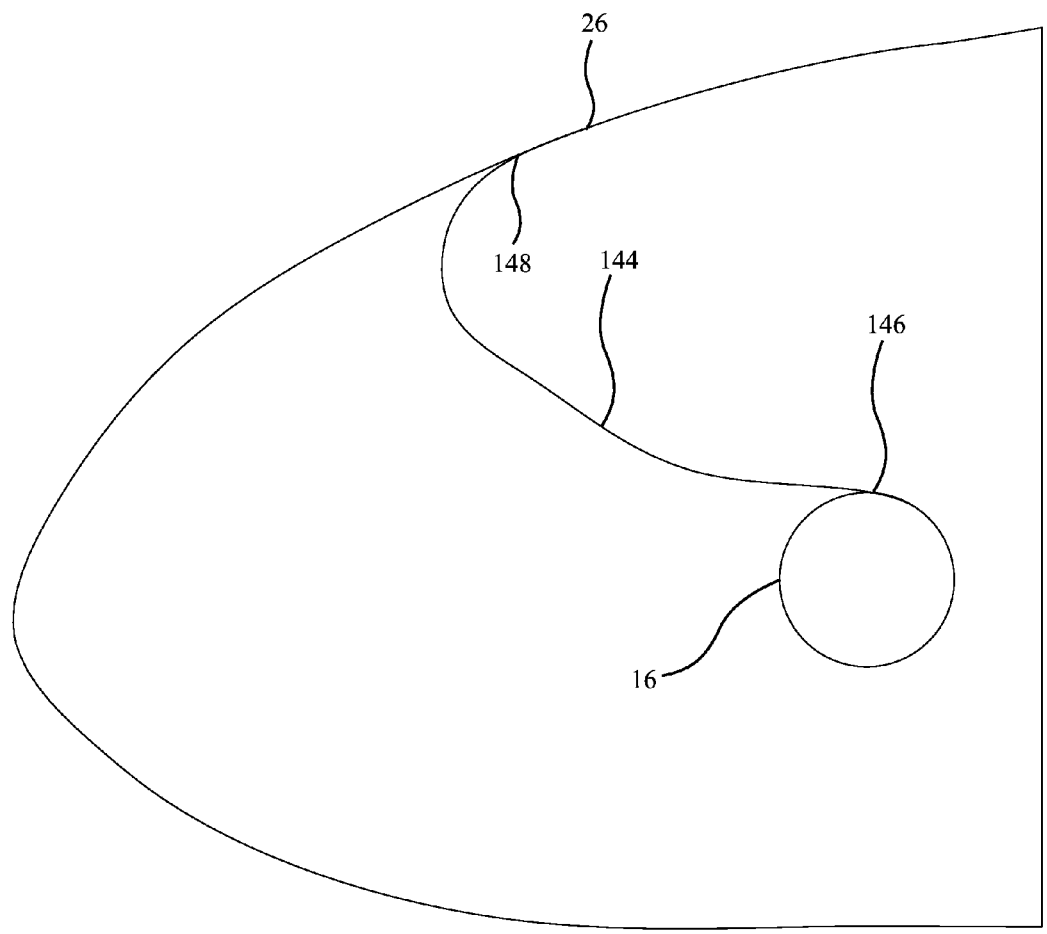
FIG. 14 is a schematic side view of the wing leading edge volume and bleed air duct with a tenth embodiment of the waste energy harvesting system employing a flexible thin film TEG extending from the bleed air duct as a hot side interface to a cold side interface on the wing leading edge skin.

FIG. 14 demonstrates a tenth embodiment of the thermal energy harvester and power conversion system. A thermoelectric film 144 (also referred to as a thin film TEG) is routed from the bleed air duct 16 to the wing skin 26. Elevated temperature of a hot end 146 of the thermoelectric film operably engaged with the bleed air duct 16 and operable connection of a cold end 148 to the wing skin 26 provides thermal differential for operation of the thermoelectric film 144 to generate electrical current to be supplied to the power feeders 30. An exemplary thermoelectric film to be employed in this embodiment is Perpetua Flexible Thermoelectric Film produced by Perpetua Power Source Technologies, Inc. In alternative embodiments a metallic foil or sheet with thermopiles printed onto its surface may be employed as the thermoelectric film. As with the TEG embodiments described, Conductive heat transfer through the thermoelectric film 144 generates electrical current to be routed to the power feeders 30 as previously described.

Figure 1B:
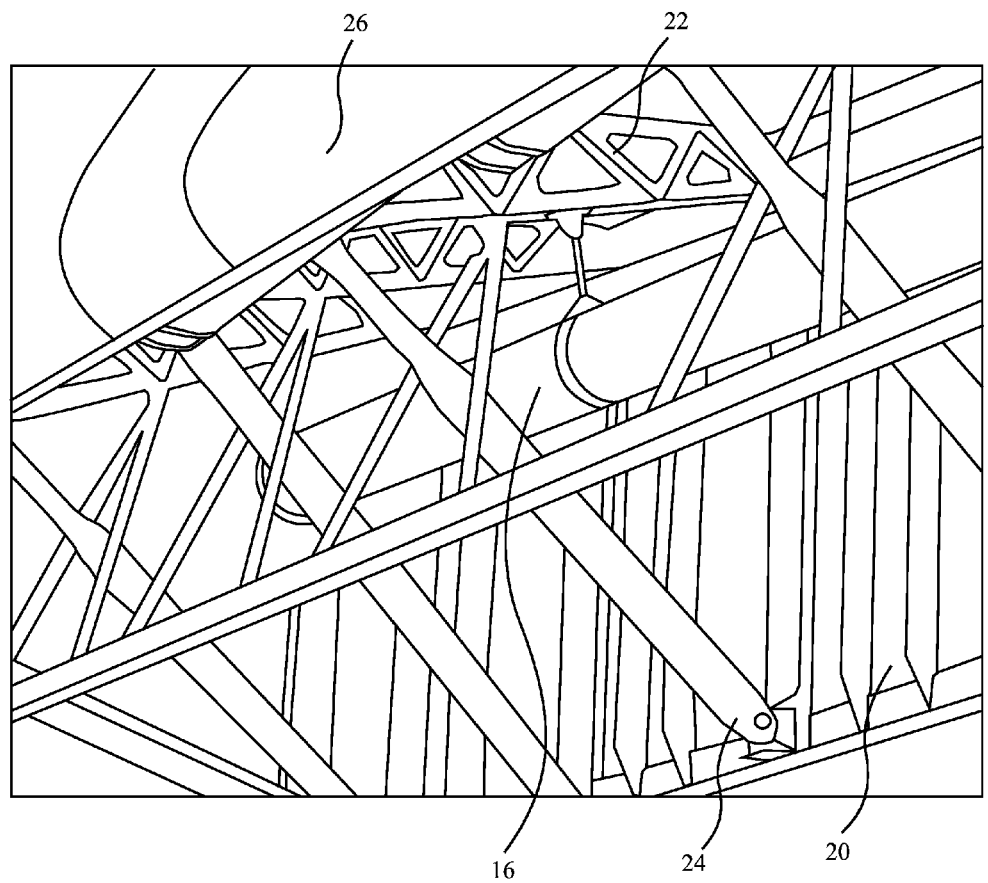
FIG. 1B is a detailed pictorial view of a wing leading edge volume with a portion of the wing skin removed to show the bleed air duct as routed in the aircraft wing.

In alternative configurations of each of the embodiments described herein an APU exhaust duct 17 (as seen in FIG. 1A) may be employed in place of the bleed air duct with comparable fuselage skin and volumes through which the exhaust duct is routed providing the cold ambient condition. Additionally, while the embodiments disclosed herein identify a wing leading edge volume for a cold ambient air source or a wing skin as an interface to external air as the cold ambient air source any volume or external surface or skin of the aircraft may be employed for the cold ambient air source interface.

Figure 15:
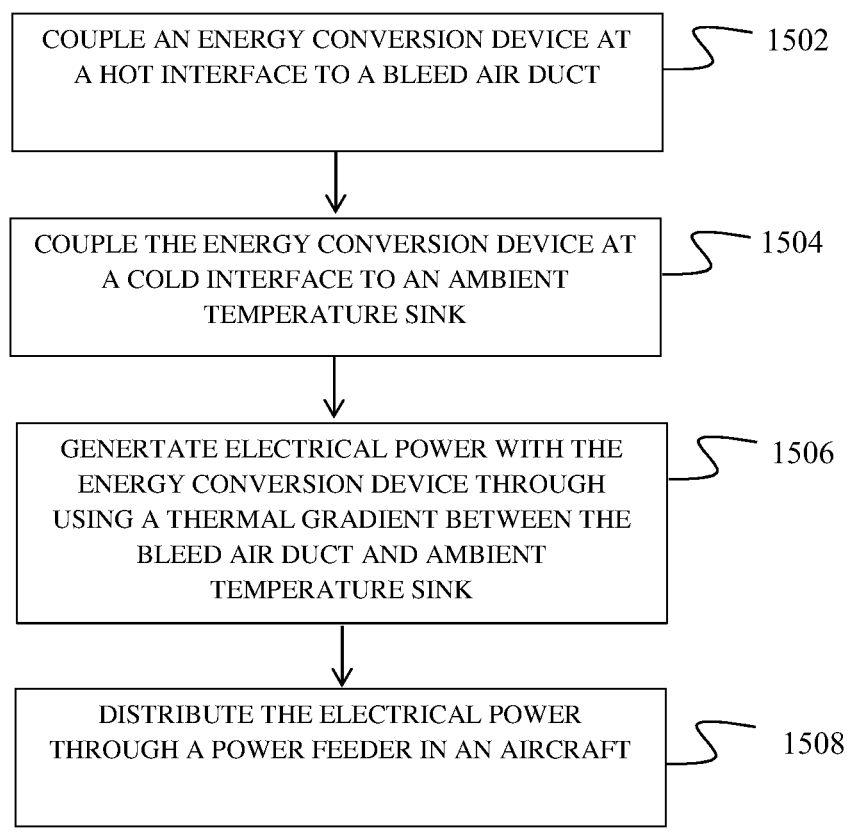
FIG. 15 is a flow chart describing a method for waste heat recovery from a bleed air system for electrical power generation.

As shown in FIG. 15, the embodiments herein provide a method for generation of supplemental electrical power from waste heat in bleed air ducting of an aircraft by coupling an energy conversion device at a hot interface to a bleed air duct, step 1502 and coupling the energy conversion device at a cold interface to an ambient temperature sink, step 1504. Electrical power is then generated with the energy conversion device through using a thermal gradient between the bleed air duct and ambient temperature sink, step 1506. The electrical power is then distributed through a power feeder in an aircraft, step 1508. The coupling of the energy conversion device at a hot interface may be accomplished by coupling a hot interface of a rigid thermoelectric generator (TEG), a thin film thermal generator or a Rankine or Sterling engine to the bleed air duct. The coupling of the energy conversion device at the hot interface may also be accomplished by engaging a heat pipe or pumped fluid conduit to the bleed air duct and coupling the heat pipe or pumped fluid conduit to the hot interface.

Coupling of the energy conversion device at a cold side interface may be accomplished by operatively engaging a convective heat exchanger to the cold side interface or engaging a heat pipe from the cold side interface to a skin of the aircraft.

Alternatively, coupling the energy conversion device at a cold side interface may be accomplished by engaging a cold interface of a thin film thermal generator to an aircraft skin.

Coupling the energy conversion device at a hot side interface may further include installing a sleeve over the bleed air duct and forcing working fluid from the sleeve for convective heat transfer to the hot side interface or coupling the energy conversion device at a cold side interface may be accomplished by installing the sleeve over the bleed air duct and operably coupling the hot side interface of the energy conversion device to the bleed air duct inside the sleeve and convectively transferring heat from the cold side interface with working fluid in the sleeve.

Having now described various embodiments of the disclosure in detail as required by the patent statutes, those skilled in the art will recognize modifications and substitutions to the specific embodiments disclosed herein. Such modifications are within the scope and intent of the present disclosure as defined in the following claims.

What is claimed is:

1. A thermal energy harvester and power conversion system comprising:
   a bleed air duct supported within a leading edge of a wing and connected to receive a flow of bleed air from an engine;
   a surface of the leading edge exposed to external air;
   an energy conversion device having a hot interface operably engaged to the bleed air duct and a cold interface operably engaged to the surface of the leading edge;
   wherein the energy conversion device generates electrical power from a thermal gradient between the bleed air duct and the surface of the leading edge, said energy conversion device electrically connected to a power feeder.

2. The system of claim 1 wherein the energy conversion device comprises at least one of a rigid thermoelectric generator (TEG), a thin-film TEG and a Rankine engine.

3. The system of claim 2 further comprising a thermal conductor engaged between the bleed air duct and the hot interface.

4. The system of claim 3 wherein the energy conversion device is a TEG and the thermal conductor comprises a geometric adapter to adapt the TEG for operable engagement of the bleed air duct.

5. The system of claim 4 wherein the thermal conductor further comprises a thermal compound or a carbon felt.

6. The system of claim 3 wherein the thermal conductor comprises a heat pipe or circulated fluid conduit engaged between the bleed air duct and the hot interface.

7. The system of claim 1 wherein the leading edge of the wing incorporates a volume in which the bleed air duct is supported.

8. The system of claim 1 further comprising a convective heat sink connected to the cold interface and extending into the volume within the leading edge.

9. The system of claim 8 further comprising a fan blowing over the convective heat sink.

10. The system of claim 2 wherein the energy conversion device is a Rankine engine and the cold interface comprises a condenser in the Rankine engine.

11. The system of claim 1 further comprising a heat pipe or circulated fluid conduit engaged intermediate the cold interface and the surface of the leading edge.

12. The system of claim 1 further comprising
    a sleeve installed concentrically over the bleed air duct;
    a heat exchanger operably engaged to the hot interface and connected to the sleeve; and a fan urging working fluid from the sleeve through the heat exchanger for convective thermal transfer.

13. A method for generation of supplemental electrical power from waste heat in bleed air ducting of an aircraft comprising the steps of:
    coupling an energy conversion device at a hot interface to a bleed air duct supported within a leading edge of a wing and connected to receive a flow of bleed air from an engine;
    coupling the energy conversion device at a cold interface to a surface of the leading edge exposed to external air as an ambient temperature sink;
    generating electrical power with the energy conversion device by using a thermal gradient between the bleed air duct and ambient temperature sink; and,
    distributing the electrical power through a power feeder in an aircraft.

14. The method of claim 13 wherein the coupling an energy conversion device at a hot interface comprises coupling a hot interface of a rigid thermoelectric generator (TEG), a thin film thermal generator or a Rankine engine to the bleed air duct.

15. The method of claim 14 wherein coupling the energy conversion device at the hot interface comprises engaging a heat pipe or pumped fluid conduit to the bleed air duct and coupling the heat pipe or pumped fluid conduit to the hot interface.

16. The method of claim 13 wherein coupling the energy conversion device at a cold side interface comprises operatively engaging a convective heat exchanger to the cold side interface.

17. The method of claim 13 wherein coupling the energy conversion device at a cold side interface comprises operatively engaging a heat pipe from the cold side interface to a skin of the leading edge.

18. The method of claim 13 wherein coupling the energy conversion device at a cold side interface comprises engaging a cold interface of a thin film thermoelectric generator to a skin of the leading edge.

19. The method of claim 13 wherein coupling the energy conversion device at a hot side interface further comprises installing a sleeve over the bleed air duct and forcing working fluid from the sleeve for convective heat transfer to the hot side interface.

20. The method of claim 13 wherein coupling the energy conversion device at a cold side interface further comprises installing a sleeve over the bleed air duct and operably coupling the hot side interface of the energy conversion device to the bleed air duct inside the sleeve and convectively transferring heat from the cold side interface with working fluid in the sleeve.

* * * * *